United States Patent
Yang

(10) Patent No.: US 7,923,324 B2
(45) Date of Patent: Apr. 12, 2011

(54) METHOD FOR MANUFACTURING CAPACITOR OF SEMICONDUCTOR DEVICE

(75) Inventor: Taek-Seung Yang, Yeoju-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 134 days.

(21) Appl. No.: 12/478,279

(22) Filed: Jun. 4, 2009

(65) Prior Publication Data
US 2009/0305478 A1    Dec. 10, 2009

(30) Foreign Application Priority Data
Jun. 5, 2008   (KR) .................. 10-2008-0052941

(51) Int. Cl.
*H01L 21/8242* (2006.01)
(52) U.S. Cl. ............... 438/239; 438/240; 257/E27.048; 257/E21.008
(58) Field of Classification Search .................. 438/239, 438/240, 253, 293, 396; 257/E27.048, E21.008, 257/E21.396, E21.648, E21.664
See application file for complete search history.

(56) References Cited

U.S. PATENT DOCUMENTS
2002/0192897 A1* 12/2002 Molloy et al. ................ 438/239
2005/0227378 A1* 10/2005 Moise et al. ..................... 438/3

FOREIGN PATENT DOCUMENTS
KR   10-2005-0122634   12/2005
KR   10-2006-0069593   6/2006
KR   10-2007-0069946   7/2007

* cited by examiner

*Primary Examiner* — Brook Kebede
(74) *Attorney, Agent, or Firm* — Sherr & Vaughn, PLLC

(57) ABSTRACT

A method for manufacturing a capacitor of a semiconductor device includes forming a lower metal layer over a substrate, forming a dielectric layer over the lower metal layer, forming an upper metal layer over the dielectric layer, forming an upper electrode and a dielectric layer pattern by performing a reactive ion etching process with respect to the upper metal layer using the dielectric layer as an etch stop layer, and exposing a top surface of the lower metal layer, and performing a chemical down-stream etch (CDE) process to remove a by-product of a sidewall of the upper electrode.

20 Claims, 4 Drawing Sheets

METHOD FOR MANUFACTURING CAPACITOR OF SEMICONDUCTOR DEVICE

Figure 1:
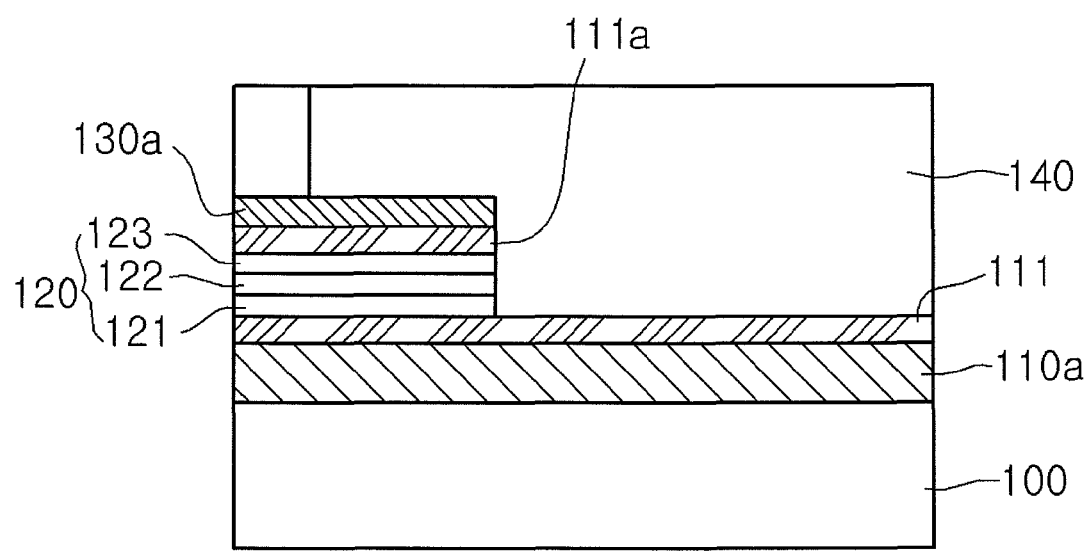

The present application claims priority under 35 U.S.C. 119 to Korean Patent Application No. 10-2008-0052941 (filed on Jun. 5, 2008), which is hereby incorporated by reference in its entirety.

BACKGROUND

A capacitor may be used to store predetermined data in a memory device such as a dynamic random access memory (DRAM). The capacitor includes capacitor electrodes, referred to as storage and plate nodes, and a dielectric layer interposed between the capacitor electrodes.

Recently, as semiconductor memory devices have become more highly integrated, chip area for a memory cell in semiconductor memory devices has been reduced, and the operating voltage of semiconductor memory devices has been lowered. In this regard, a capacitor, which is one of components of the semiconductor memory device, must have the charge quantity necessary for the operation of the semiconductor memory device even if the projected area of the capacitor is reduced. If the charge quantity is insufficient, many problems such as soft errors and short refresh times of the semiconductor memory device may occur. As can be understood from an equation, Q=CV, the charge quantity is determined as a function of an operating voltage (V) applied to the capacitor and capacitance (C) of the capacitor. However, since the operating voltage (V) is decreased as the memory device becomes more highly integrated, the capacitance (C) must be increased in order to obtain sufficient charge quantity. Accordingly, sufficient capacitance (C) must be ensured even in a smaller area. The capacitance (C) can be represented as the following equation.

$$C = \in S/d \qquad \text{[Equation 1]}$$

In Equation 1, C, $\in$, S, and d represent capacitance, the permittivity of a dielectric substance, a sectional area of a pole plate, and a distance between two pole plates, respectively. According to Equation 1, the capacitance is proportional to the permittivity of the dielectric substance and an effective area of a capacitor, and inversely proportional to the thickness of the dielectric substance. In other words, the capacitance is proportional to the surface area of an electrode and the permittivity of the dielectric substance, and inversely proportional to the distance between electrodes. Accordingly, to obtain a capacitor having high capacitance, the surface area of the electrode must be enlarged, or the dielectric layer must have high permittivity. In addition, the distance between the electrodes must be reduced, that is, the thickness of the dielectric substance must be minimized.

Regarding an electrode material of the capacitor, since various characteristics are required due to high integration and high performance of semiconductor devices, a capacitor having a metal-insulator-metal (MIM) structure of a metallic electrode has been employed.

SUMMARY

According to embodiments, a method for manufacturing a capacitor of a semiconductor device is performed. The method includes forming a lower metal layer over a substrate, forming a dielectric layer over the lower metal layer, forming an upper metal layer over the dielectric layer, forming an upper electrode and a dielectric layer pattern by performing a reactive ion etching process with respect to the upper metal layer using the dielectric layer as an etch stop layer, and exposing a top surface of the lower metal layer, and performing a chemical down-stream etch (CDE) process to remove a by-product of a sidewall of the upper electrode.

According to embodiments, a method for manufacturing a capacitor of a semiconductor device is performed. The method includes forming a lower metal layer over a substrate, forming a first dielectric layer over the lower metal layer, forming a second dielectric layer over the first dielectric layer, forming a third dielectric layer over the second dielectric layer, forming an upper metal layer over the third dielectric layer, forming an upper electrode and first to third dielectric layer patterns by performing a reactive ion etching process with respect to the upper metal layer using the first to third dielectric layers as an etch stop layer, and exposing a top surface of the lower metal layer, and performing a chemical down-stream etch (CDE) process to remove a by-product of a sidewall of the upper electrode.

According to embodiments, capacitor short can be prevented by removing a by-product, which has been generated when the upper electrode of the capacitor is etched, through an isotropic etching process, so that the product yield can be improved.

According to embodiments, even if the lower electrode is exposed when the upper electrode of the capacitor is etched, the upper electrode can be prevented from being shorted with the lower electrode. Accordingly, since process faults may not occur when forming the thin dielectric layer, the reliability for the manufacturing process can be ensured.

The capacitor of the semiconductor device according to embodiments can have superior endurance with high capacitance.

According to the method for manufacturing the semiconductor device of embodiments, a thin dielectric layer having a high dielectric constant can be stably formed, and superior process reliability and productivity can be represented.

According to the capacitor of the semiconductor device of embodiments, the dielectric layers having a wide band gap are formed on/below a dielectric layer having a narrow band gap, so that a stable electrical characteristic can be obtained and a leakage current characteristic can be improved.

DRAWINGS

Example FIG. 1 is a sectional view showing a capacitor of a semiconductor device according to embodiments.

Figure 2:
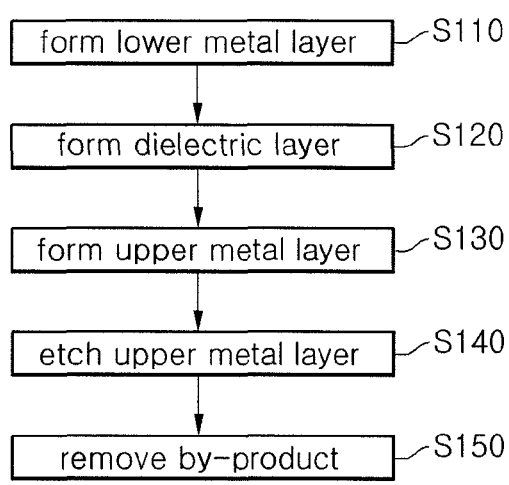
Figure 3:
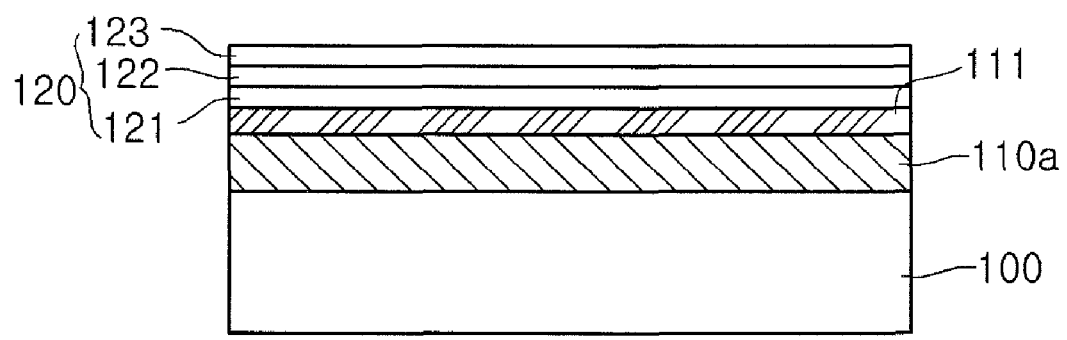

Example FIG. 2 is a flowchart showing the manufacturing process of the capacitor of the semiconductor device according to embodiments.

Example FIGS. 3 to 7 are sectional views showing the manufacturing process of the capacitor of the semiconductor device according to embodiments.

DESCRIPTION

Hereinafter, a method for manufacturing a capacitor of a semiconductor device according to embodiments will be described with reference accompanying drawings. Example FIG. 1 is a sectional view showing the capacitor of the semiconductor device according to embodiments. Referring to example FIG. 1, a barrier metal layer 111 may be stacked over a lower electrode 110a formed over a substrate, and a dielectric layer pattern may be formed over the barrier metal layer 111. An upper barrier metal layer 111a may be stacked over the dielectric layer pattern, and an upper electrode 130a may be formed over the upper barrier metal layer 111a.

The lower electrode 110a and the upper electrode 130a may be copper metal layers. When the lower electrode 110a and the upper electrode 130a are formed as copper metal layers, a damascene process may be used. According to the damascene process, a trench is formed by partially etching an insulating layer through a photo-etch process, and a copper seed layer is deposited over the insulating layer such that the trench is filled with the copper seed layer. Then, the resultant structure is planarized through chemical mechanical polishing (CMP) process, thereby forming the copper interconnection.

The lower electrode 110a and the upper electrode 130a may be aluminum metal layers. When the lower electrode 110a and the upper metal layer 130a are formed as aluminum metal layers, the aluminum metal layers are formed over an insulating layer, and the resultant structure is patterned through a photo-process.

The lower electrode 110a and the upper electrode 130a are not limited to copper and aluminum. The lower electrode 110a and the upper electrode 130a may be formed by using various conductive materials used in semiconductor devices to form metal interconnections. A capacitor according to the embodiment may be formed between metal interconnections. Accordingly, an electrode of the capacitor may include a metal interconnection.

The barrier metal layers 111 and 111a may have a double structure of titanium (Ti)/titanium-nitride (TiN), and tantalum (Ta) may be used instead of Ti.

A dielectric layer 120 may include a single layer or multiple layers.

Although the dielectric layer may include silicon nitride (SiN), the dielectric layer may include at least one of hafnium oxide ($HfO_2$), zirconium oxide ($ZrO_2$) and tantalum oxide ($Ta_2O_5$).

The dielectric layer may have a thickness of about 1 Å to about 300 Å.

The dielectric layer pattern may include first to third dielectric layer patterns 121a to 123a. The first dielectric layer pattern 121a may include the same material as that of the third dielectric layer pattern 123a. The first dielectric layer pattern 121a and the third dielectric layer pattern 123a may include $Al_2O_3$. The second dielectric layer pattern 122a may include at least one of $HfO_2$, $ZrO_2$ and $Ta_2O_5$.

The first and third dielectric layer patterns 121a and 123a may have a bad gap wider than that of the second dielectric layer pattern 122a. The band gap of the second dielectric layer pattern 122a may be 5.7 eV or less, so characteristics such as a leakage current characteristic may be significantly degraded if the second dielectric layer pattern 122a is thin. However, since the first and third dielectric layer patterns 121a and 123a, having a wider band gap, are formed over and below the second dielectric layer pattern 122a, the leakage current characteristic and a breakdown voltage characteristic can be improved.

The dielectric constant of the second dielectric layer pattern 122a may be greater than those of the first and third dielectric layer patterns 121a and 123a. The thickness of the dielectric layer pattern may be 160 Å±10 Å.

In detail, the thickness of the first dielectric layer pattern 121a may be 30 Å±2 Å, and the thickness of the second dielectric layer pattern 122a may be 100 Å±5 Å. In addition, the thickness of the third dielectric layer pattern 123a may be 30 Å±2 Å. The capacitor having the dielectric structure according to embodiments may have a capacitance of about 8 $fF/\mu^2$ to about 10 $fF/\mu^2$. In this case, a by-product is not formed over a sidewall of the dielectric layer pattern and the upper electrode 130a, and the lower electrode 110a is electrically insulated from the upper electrode 130a. In addition, the sidewall of the dielectric layer pattern is in a line with the sidewall of the upper electrode 130a. This is because the dielectric layer has a thinness of about 1 Å to 300 Å so that the dielectric layer is etched when the upper electrode 130a is etched. The capacitor according to embodiments may have capacitance of 4 $fF/\mu^2$ or more.

Example FIG. 2 is a flowchart showing the manufacturing process of the capacitor of a semiconductor device according to embodiments, and example FIGS. 3 to 7 are sectional views showing the manufacturing process of a capacitor according to embodiments. Referring to example FIGS. 2 and 3, the barrier metal layer 111 is formed over the substrate 100, and a lower metal layer is formed over the barrier metal layer 111. The substrate 100 may be a semiconductor substrate including an insulating layer formed with copper metal interconnections, and the lower metal layer may include copper. The barrier metal layer 111 may prevent copper from being diffused into an adjacent layer.

The substrate 100 may be a semiconductor substrate provided thereon with an insulating layer having aluminum metal interconnections, and the lower metal layer may include aluminum. When the lower electrode 110a includes aluminum, the barrier metal layer 111 may be not formed.

The barrier metal layer 111 may include at least one of Ti, Ta, Ti/TiN and Ta/TaN. If the barrier metal layer 111 includes Ti/TiN, a Ti layer may be formed over the lower metal layer, and a TiN layer may be formed over the Ti layer.

After the substrate 100 formed with the lower metal layer is put into an automatic layer deposition (ALD) equipment, first to third dielectric layers 121 to 123 are sequentially deposited over the lower metal layer. When a dielectric layer 120 is formed through the ALD, the dielectric layer 120 is formed with a thickness of about 0.8 Å for one cycle. If several cycles are repeated, the dielectric layer 120 may be formed with a desired thickness. When the ALD is performed, a process temperature may be in the range of about 300° C. to 400° C.

First, the first dielectric layer 121 is deposited over the substrate 100 formed with the lower metal layer (step S120). The material of the first dielectric layer 121 may be aluminum oxide ($Al_2O_3$). The first dielectric layer 121 may be a thickness of about 30 Å±2 Å. The material of the first dielectric layer 121 may be formed by allowing ozone ($O_3$) to react with trimethylaluminum (TMA) serving as a precursor.

Next, after the first dielectric layer 121 has been deposited, the second dielectric layer 122 is subsequently deposited over the first dielectric layer 121. The material of the second dielectric layer 122 may be hafnium oxide ($HfO_2$). In addition, the material of the second dielectric layer 122 may be one of zirconium oxide ($ZrO_2$) and tantalum pentoxide ($Ta_2O_5$). The second dielectric layer 122 may have a thickness of about 100 Å±5 Å. The material of the second dielectric layer 122 may be formed by allowing $O_3$ to react with tetrakis[ethyl methyl amino]hafnium (TEMAHf) serving as a precursor.

Then, after the second dielectric layer 122 has been deposited, the third dielectric layer 123 is subsequently deposited over the second dielectric layer 122. The material of the third dielectric layer may be $Al_2O_3$. The third dielectric layer 123 may have a thickness of 30 Å±2 Å. The material of the third dielectric layer 123 may be formed by allowing $O_3$ to react with trimethylaluminum(TMA) serving as a precursor.

The total thickness of the first to third dielectric layer 121 to 123 may be in the range of about 160 Å±10 Å. Therefore, when comparing with a related capacitor, the capacitor according to embodiments is thinner with a higher capacitance. The capacitor having the stacking structure, the material, and the thickness may have capacitance of about 8~10 $fF/\mu^2$.

Figure 4:
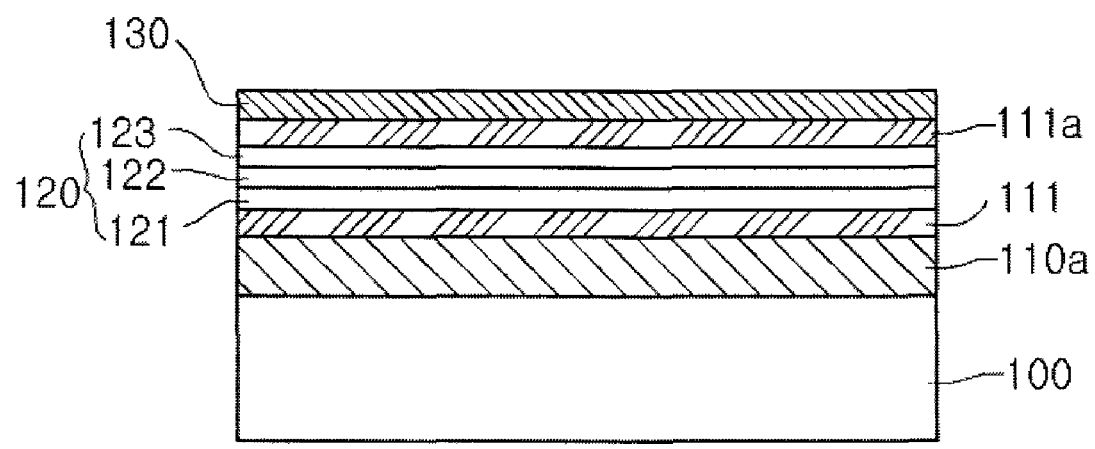

As shown in example FIGS. 2 and 4, the upper barrier metal layer 111a and an upper metal layer 130 are formed over the dielectric layer 120 (step S130). The upper metal layer 130 may include a copper metal layer or an aluminum metal layer. The upper barrier metal layer 111a may include at least one of Ti, Ta, Ti/TiN and Ta/TaN.

Since the first and third dielectric layers 121 and 123 have a band gap wider than that of the second dielectric layer 122, the dielectric layer 120 represents superior leakage current and breakdown voltage characteristics. In addition, since the second dielectric layer 122 has a large dielectric constant, high capacitance can be represented.

Figure 5:
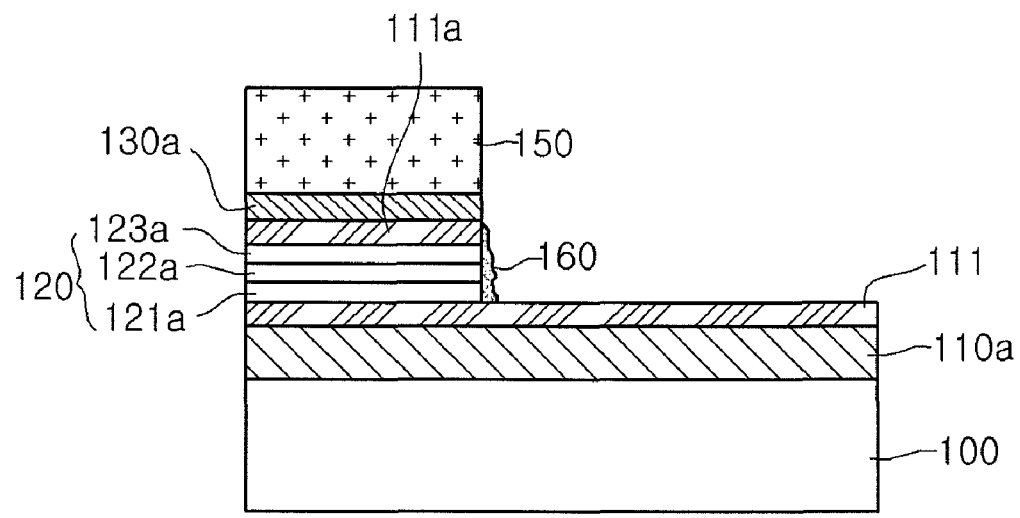

As shown in example FIGS. 2 and 5, a photoresist pattern 150 is formed over the upper metal layer 130. The photoresist pattern 150 may be formed by coating a photoresist layer over the upper metal layer 130 and partially performing an exposure and development process so that a portion of the upper metal layer 130 to be etched is exposed. The upper metal layer 130 is formed by using the photoresist pattern 150 as a mask. The upper metal layer 130 may be etched through a reactive ion etching process (step S140). The reactive ion etching process for the upper metal layer 130 is an anisotropic etching process in which an etching process is actively performed perpendicularly to the semiconductor substrate. The dielectric layer 120 is used as an etch stop layer in order to detect an etch stop point of the reactive ion etching process.

Since the thickness of the dielectric layer 120 is thin, the dielectric layer 120 is etched when the upper metal layer 130 is etched through the reactive ion etching process. Accordingly, a top surface of the lower metal layer may be exposed. In this case, a by-product 160 including metal particles and polymer may be generated and attached to the sidewall of the upper electrode 130a and the dielectric pattern.

Figure 6:
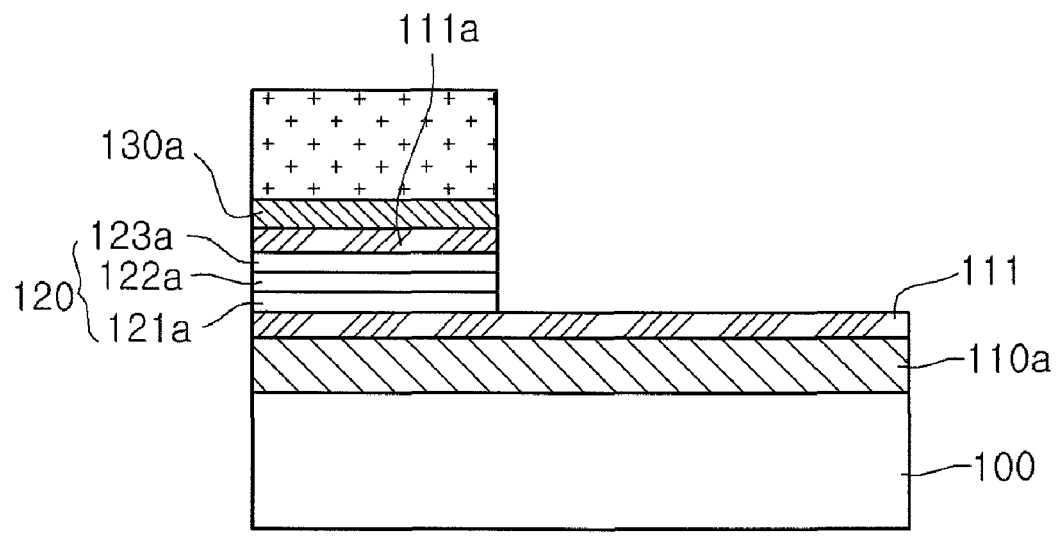

As shown in example FIGS. 2 and 6, in order to the by-product 160, a chemical dry etch (chemical down-stream etch (CDE)) process is performed after the reactive ion etching process has been performed with respect to the upper metal layer 130 (step S150). The CDE process corresponds to both a dry etching process and an isotropic etching process. The isotropic etching process actively etches the semiconductor substrate in all directions.

Accordingly, the by-product 160 is removed from the sidewall of the upper electrode 130a and the dielectric layer pattern to expose the sidewall of the upper electrode 130a and the dielectric layer pattern. Accordingly, the upper electrode 130a is prevented from being shorted with the lower electrode 110a.

The CDE process may be performed under conditions of RF power of about 600 W to about 800 W, pressure of about 1 Pa to about 100 Pa, an $O_2$ flow rate of about 5 sccm to about 400 sccm, a $CF_4$ flow rate of about 300 sccm to about 500 sccm, and a $N_2$ flow rate of about 50 sccm to about 300 sccm. The CDE process may be performed for 40 seconds to 400 seconds. Thereafter, the lower metal layer may be etched through the reactive ion etching process, thereby forming the lower electrode 110a.

Figure 7:
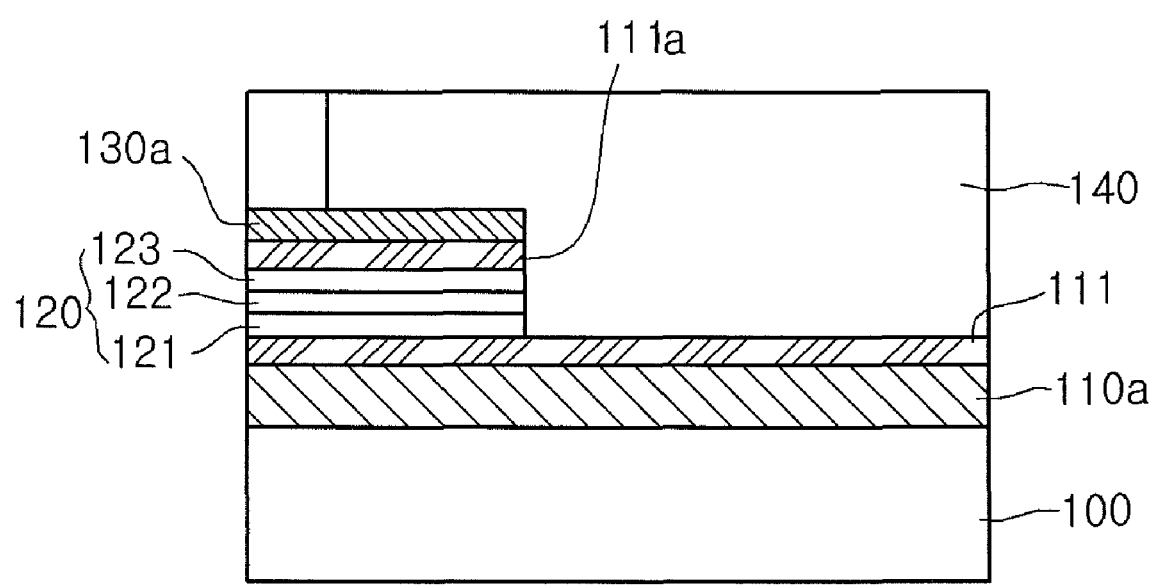

As shown in example FIG. 7, an insulating layer 140 is formed over the entire surface of the substrate 100 to cover the capacitor and a via is formed, thereby performing a semiconductor process. According to embodiments, a short in the capacitor can be prevented by removing a by-product, which has been generated when the upper electrode 130a of the capacitor is etched, through an isotropic etching process, so that the yield rate can be improved.

According to embodiments, even if the lower metal layer is exposed when the upper electrode 130a is etched, a short between the upper and lower electrodes is not caused by impurities. Accordingly, since process faults may not occur when forming the thin dielectric layer, the reliability for the manufacturing process can be ensured. The capacitor of the semiconductor device according to embodiments can have superior endurance with high capacitance.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a lower metal layer over a substrate;
   forming a dielectric layer over the lower metal layer;
   forming an upper metal layer over the dielectric layer;
   forming an upper electrode and a dielectric layer pattern by performing a reactive ion etching process with respect to the upper metal layer using the dielectric layer as an etch stop layer, and exposing a top surface of the lower metal layer; and
   performing a chemical down-stream etch process to remove a by-product of a sidewall of the upper electrode.

2. The method of claim 1, including forming a lower electrode by performing a reactive ion etching process with respect to the lower metal layer after the chemical down-stream etch process has been performed.

3. The method of claim 1, wherein a second dielectric layer includes at least one selected from the group consisting of hafnium oxide ($HfO_2$), zirconium oxide ($ZrO_2$) and tantalum oxide ($Ta_2O_5$).

4. The method of claim 1, wherein first and second dielectric layers include aluminum oxide ($Al_2O_3$).

5. The method of claim 1, wherein a total thickness of first to third dielectric layers is in a range of about 1 Å to about 300 Å.

6. The method of claim 1, wherein the chemical down-stream etch process is performed under conditions of RF power of about 600 W to about 800 W, pressure of about 1 Pa to about 100 Pa, an $O_2$ flow rate of about 5 sccm to about 400 sccm, a $CF_4$ flow rate of about 300 sccm to about 500 sccm, a $N_2$ flow rate of about 50 sccm to about 300 sccm, and process time of about 40 seconds to about 400 seconds.

7. The method of claim 1, including forming a barrier metal layer over the lower metal layer.

8. The method of claim 7, including forming a barrier metal layer over the dielectric layer.

9. The method of claim 8, wherein the upper and lower metal layers are formed using copper.

10. A method comprising:
    forming a lower metal layer over a substrate;
    forming a first dielectric layer over the lower metal layer;
    forming a second dielectric layer over the first dielectric layer;
    forming a third dielectric layer over the second dielectric layer;
    forming an upper metal layer over the third dielectric layer;
    forming an upper electrode and first to third dielectric layer patterns by performing a reactive ion etching process with respect to the upper metal layer using the first to third dielectric layers as an etch stop layer, and exposing a top surface of the lower metal layer; and
    performing a chemical down-stream etch process to remove a by-product of a sidewall of the upper electrode.

11. The method of claim 10, wherein the first and third dielectric layers are formed by depositing $Al_2O_3$ using trimethylaluminum and ozone ($O_3$).

12. The method of claim 10, wherein the second dielectric layer is formed by depositing $HfO_2$ using tetrakis[ethylmethylamino]hafnium and $O_3$.

13. The method of claim 10, wherein the second dielectric layer includes at least one selected from the group consisting of $HfO_2$, $ZrO_2$ and $Ta_2O_5$, and the first and third dielectric layers include $Al_2O_3$.

14. The method of claim 10, wherein the capacitor having the dielectric layer has capacitance in a range of about 8 $fF/\mu^2$ to about 10 $fF/\mu^2$.

15. The method of claim 10, wherein the CDE process is performed under conditions of RF power of about 600 W to about 800 W, pressure of about 1 Pa to about 100 Pa, an $O_2$ flow rate of about 5 sccm to about 400 sccm, a $CF_4$ flow rate of about 300 sccm to about 500 sccm, a $N_2$ flow rate of about 50 sccm to about 300 sccm, and process time of about 40 seconds to about 400 seconds.

16. The method of claim 10, wherein the first and third dielectric layers are formed by depositing $Al_2O_3$ through an automatic layer deposition scheme by using trimethylaluminum and ozone ($O_3$).

17. The method of claim 10, wherein the second dielectric layer is formed by depositing HfO2 through an automatic layer deposition scheme by using tetrakis[ethylmethylamino] hafnium and $O_3$.

18. The method of claim 10, wherein a thickness of the first dielectric layer is in a range of about 30 Å±2 Å, a thickness of the second dielectric layer is in a range of about 100 Å±5 Å, and a thickness of the third dielectric layer is a range of about 30 Å±2 Å.

19. The method of claim 10, including forming a barrier metal layer over the lower metal layer.

20. The method of claim 19, including forming a barrier metal layer over the dielectric layer.

* * * * *